United States Patent [19]

Grubisich

[11] Patent Number: 5,543,653
[45] Date of Patent: Aug. 6, 1996

[54] BIPOLAR AND BICMOS STRUCTURES

[75] Inventor: Michael J. Grubisich, San Jose, Calif.

[73] Assignee: National Semiconductor Corporation, Santa Clara, Calif.

[21] Appl. No.: 275,062

[22] Filed: Jul. 13, 1994

Related U.S. Application Data

[62] Division of Ser. No. 203,236, Feb. 28, 1994, Pat. No. 5,455,189.

[51] Int. Cl.$^6$ .......... H01L 27/082; H01L 29/76; H01L 29/00; H01L 27/102
[52] U.S. Cl. .......... 257/593; 257/370; 257/378; 257/550; 257/592
[58] Field of Search .......... 257/370, 378, 257/550, 552, 564, 592, 593

[56]       References Cited

U.S. PATENT DOCUMENTS

| | | | |
|---|---|---|---|
| 4,570,328 | 2/1986 | Price et al. | 29/571 |
| 4,897,709 | 1/1990 | Yokoyama et al. | 257/751 |

(List continued on next page.)

FOREIGN PATENT DOCUMENTS

| | | | |
|---|---|---|---|
| 0250721 | 1/1988 | European Pat. Off. | 257/370 |
| 0396948 | 11/1990 | European Pat. Off. | 257/370 |
| 0428067 | 5/1991 | European Pat. Off. | 257/370 |
| 0500233 | 8/1992 | European Pat. Off. | 257/370 |
| 2675311 | 10/1992 | France | 257/370 |
| 58-066352 | 4/1983 | Japan | 257/370 |

OTHER PUBLICATIONS

U.S. patent application Ser. No. 08/085,436 filed by M. J. Grubisich on Jun. 30, 1993 entitled: "Transistors and Methods for Fabrication Thereof".

Iranmanesh et al., "A 0.8–μm Advanced Single–Poly BiCMOS Technology for High–Density and High–Performance Applications," IEEE Journal of Solid State Circuits, vol. 26, No. 3, Mar., 1991, pp. 422–426.

J. L. de Jong et al., "Single Polysilicon Layer Advanced Super High–speed BiCMOS Technology," Paper 7.4, IEEE, 1989, pp. 182–185.

A. Nouailhat et al., "Development of Advanced CMOS—Compatible Bipolar Transistor for BiCMOS Technology," Electronics Letters, vol. 24, No. 25, Dec. 8, 1988, pp. 1581–1983.

Stanley Wolf, "Silicon Processing for the VLSI Era," vol. 2, Process Integration, Lattice Press, 1990, pp. 13–44, 143–150, 162–169, 482–483, 486–502, 504, 505, 510–522, 532–535, 538–543 and 546–551.

U.S. patent application Ser. No. 08/202,328, filed Feb. 28, 1994.

(List continued on next page.)

*Primary Examiner*—Steven H. Loke
*Attorney, Agent, or Firm*—Skjerven, Morrill, MacPherson, Franklin & Friel; Norman R. Klivans

[57]       ABSTRACT

In a bipolar or BiCMOS process, a heavily doped buried layer of a first conductivity type and a heavily doped channel stop region of a second conductivity type are formed in a lightly doped substrate of the second conductivity type. A lightly doped epitaxial layer of the first conductivity type is grown. An implant of the first conductivity type creates a guard ring around the bipolar transistor active region and also creates a higher-doped collector region inside the active region. In the BiCMOS process, during the formation of CMOS wells, a silicon nitride mask over the bipolar transistor inhibits oxidation of the epitaxial layer and the oxidation-enhanced diffusion of the buried layer. As a result, the epitaxial layer can be made thinner, reducing the collector resistance. The MOS transistor wells can be formed without an underlying buried layer, simplifying the process and decoupling the bipolar and MOS transistor characteristics from each other. A heavy implant of the second conductivity type creates a field implant region around each transistor. Around the bipolar transistor, the field implant region meets the channel stop region. Field oxide is grown over the field implant region by LOCOS process. A base region is formed inside the guard ring. Other features and embodiments are described in the specification, the drawings and the claims.

6 Claims, 11 Drawing Sheets

U.S. PATENT DOCUMENTS

| | | | |
|---|---|---|---|
| 4,931,411 | 6/1990 | Tigelaar | 437/192 |
| 4,933,295 | 6/1990 | Feist | 437/33 |
| 4,943,536 | 7/1990 | Havemann | 257/370 |
| 4,980,020 | 12/1990 | Douglas | 156/643 |
| 5,059,549 | 10/1991 | Furuhata | 437/59 |
| 5,094,980 | 3/1992 | Shepela | 437/189 |
| 5,098,854 | 3/1992 | Kapoor et al. | 437/31 |
| 5,100,811 | 3/1992 | Winnerl et al. | 257/370 |
| 5,102,811 | 4/1992 | Scott | 437/31 |
| 5,164,331 | 11/1992 | Lin et al. | 437/192 |
| 5,166,082 | 11/1992 | Nakamura et al. | 257/378 |
| 5,171,702 | 12/1992 | Prengle et al. | 437/59 |
| 5,175,118 | 12/1992 | Yoneda | 437/40 |
| 5,179,031 | 1/1993 | Brassington et al. | 437/31 |
| 5,218,224 | 6/1993 | Taguchi | 257/593 |
| 5,219,784 | 6/1993 | Solheim | 437/57 |
| 5,274,267 | 12/1993 | Moksvold | 257/592 |

OTHER PUBLICATIONS

U.S. patent application Ser. No. 08/202,532, filed Feb. 28, 1994.

Jong Ho Lee et al., "Under Field Oxide Dopant Enhancement (UFDE) For CMOS AMD BICMOS Technology," *Japanese Journal of Applied Physics*, vol. 29 No. 12 (Dec. 12, 1990), pp. 2292–2295.

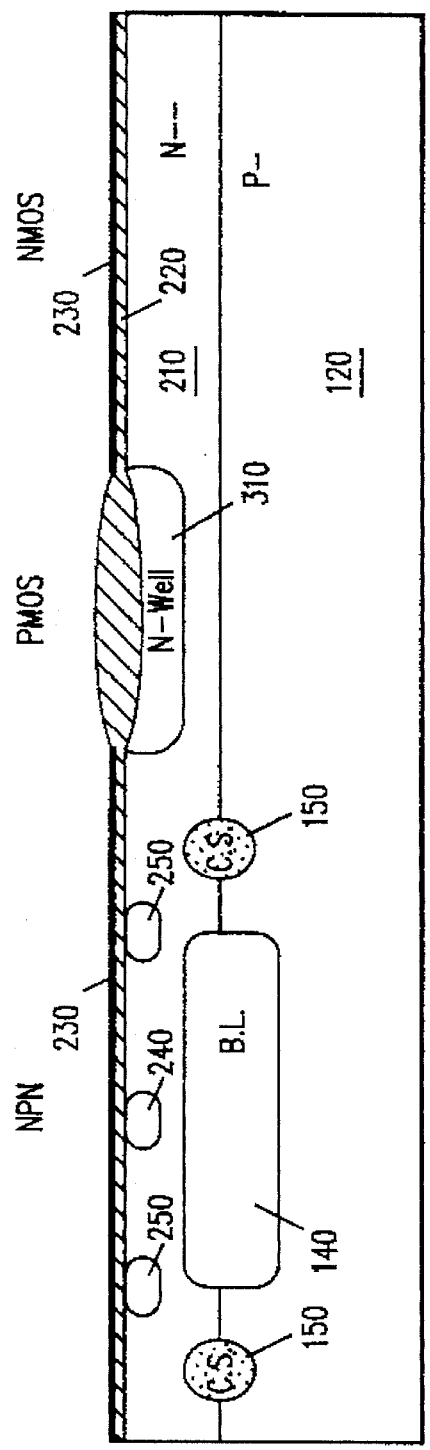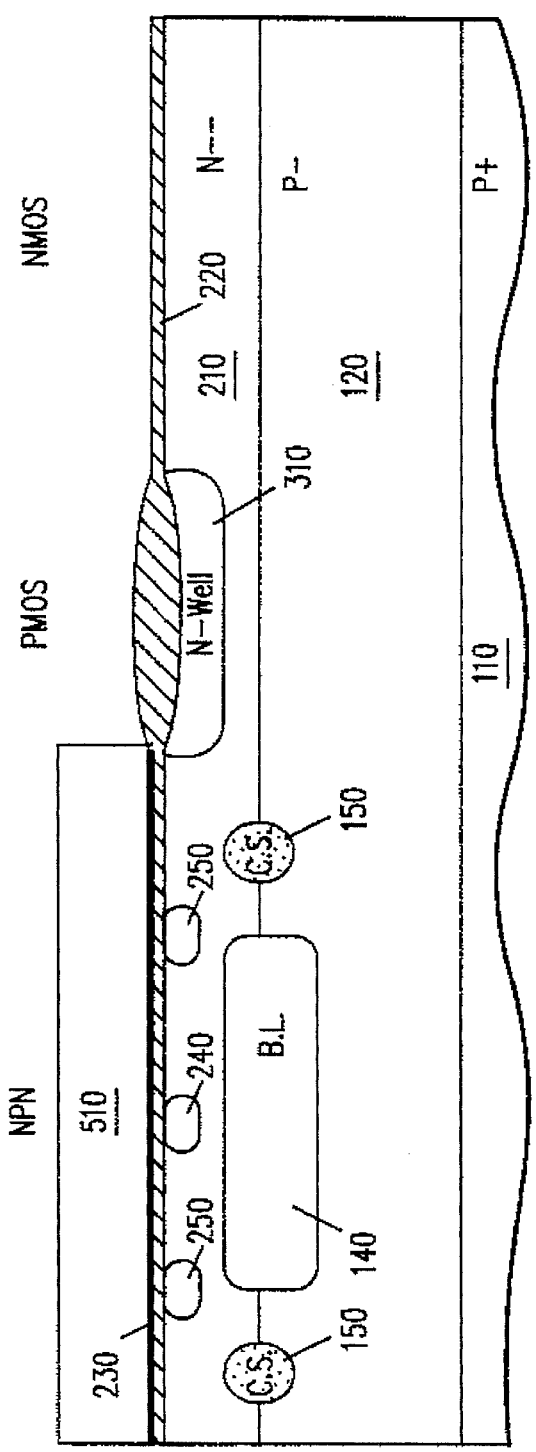
FIG. 4
FIG. 5

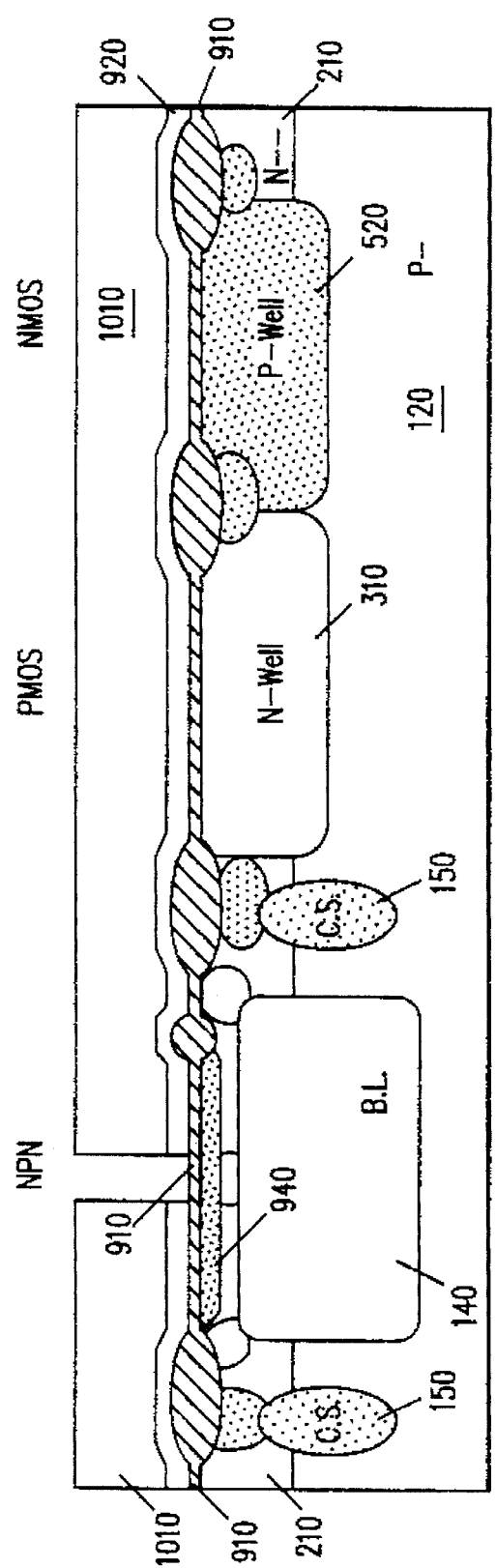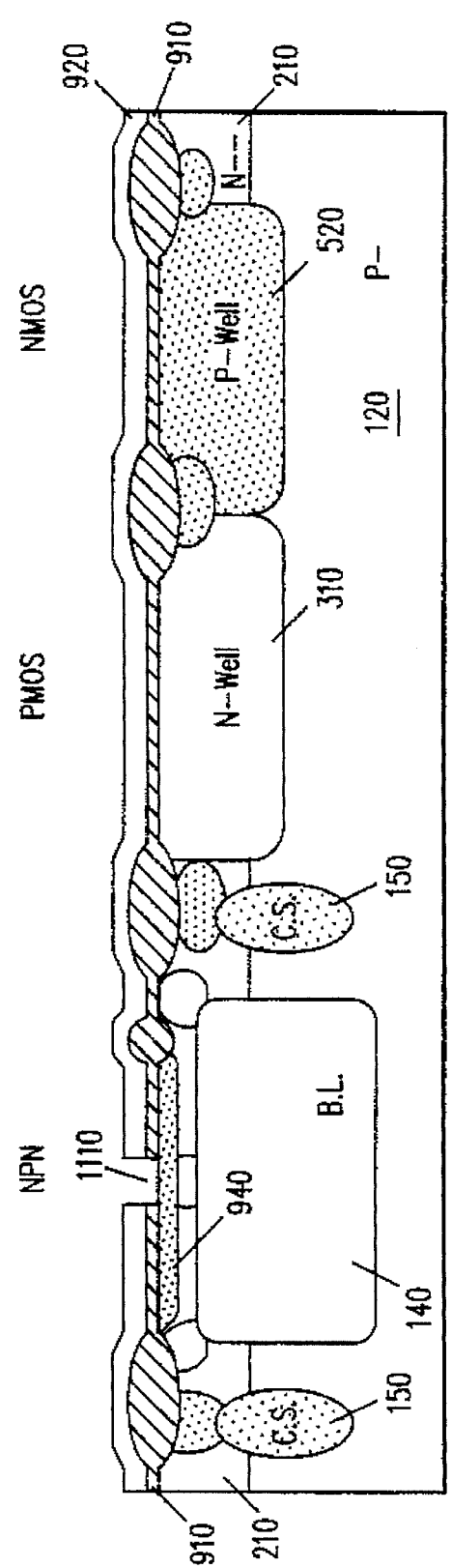
FIG. 10
FIG. 11

BIPOLAR AND BICMOS STRUCTURES

This application is a division of application Ser. No. 08/203,236, filed Feb. 28, 1994, now U.S. Pat. No. 5,455,189.

BACKGROUND OF THE INVENTION

The present invention relates to fabrication of semiconductor devices and integrated circuits, and more particularly to fabrication of bipolar and BiCMOS integrated circuits.

In integrated circuits, transistors are typically isolated from each other, and selected transistor regions are interconnected by conductive lines to form a desired circuit. It is desirable to develop isolation techniques that would provide low leakage currents, high punchthrough voltages, low capacitances, a high yield, a small transistor size, a high transistor speed and a low power consumption in bipolar and BiCMOS integrated circuits.

BiCMOS circuits present a particular challenge for fabrication because BiCMOS processes are typically more complex than either bipolar or CMOS processes. In order to simplify BiCMOS processes, the same steps are sometimes used to fabricate both bipolar and MOS transistor features in the process. For example, the same ion implantation step may be used to dope selected regions of both bipolar and MOS transistors. This, however, creates an interdependency between the bipolar and MOS transistors and makes it more difficult to optimize both the bipolar and MOS transistors. Thus, it is desirable to develop a simple and economical BiCMOS process that allows greater decoupling of the bipolar and MOS transistor characteristics.

SUMMARY OF THE INVENTION

The present invention provides bipolar and BiCMOS processes which provide in some embodiments low leakage currents, high punchthrough voltages, low capacitances, a high yield, a small transistor size, a high transistor speed and a low power consumption. The invention allows integrating high speed bipolar transistors into a CMOS twin well process.

In some embodiments, the transistor isolation is obtained as follows. In embodiments involving an NPN transistor (PNP transistors are similarly made), an N+ buried layer and a P+ channel stop regions are formed in a P– substrate (which is an original wafer or an epitaxial layer). A lightly doped, N–– thin epitaxial layer is grown. An N implant creates a guard ring around the bipolar transistor active region and also creates a collector region inside the active region.

Then the wells of the MOS transistors are formed by a CMOS twin well process. During the twin well formation and, in particular, well dopant drive-in, a silicon nitride mask over the bipolar transistor inhibits oxidation of the N–– epitaxial layer at the location of the bipolar transistor and oxidation-enhanced diffusion of the buried layer. As a result, the buried layer capacitance is reduced. Oxidation-enhanced stacking faults are also reduced. The stacking faults are defects in the crystal structure of the monocrystalline silicon which increase leakage current. Because the stacking fault density is reduced, the yield is improved.

Further, inhibiting the oxidation-enhanced diffusion allows the epitaxial layer to be made thinner. Consequently, in some BiCMOS embodiments in which the NMOS P-wells must diffuse through the epitaxial layer to isolate the N-wells from each other, the P-wells can be made shallower. Hence, some embodiments do not require a P type buried layer under the P-well. The process becomes simpler, and the MOS and bipolar transistor characteristics become more decoupled from each other. Therefore a greater optimization of the bipolar and MOS transistors becomes possible.

A P+ field implant creates a doped field region around each transistor. This field implant region meets the channel stop region to form a P+ ring around the bipolar transistor. Field oxide is grown by the LOCOS process around each transistor over the field implant region and the guard ring. Thus, the process integrates the bipolar transistor into a twin well CMOS process.

A P type base region is formed inside the surrounding N type guard ring. While the P+ ring and the field oxide provide good bipolar transistor isolation, the guard ring reduces the base-to-substrate leakage current and increases the punchthrough voltage of the parasitic PNP transistor formed by the base region, the P+ ring, and the portion of the N–– epitaxial layer between the base region and the P+ ring. At the same time, the N–– epitaxial portions near the base region provide a low base-collector capacitance. Hence, a high bipolar transistor speed and a low power consumption are achieved.

PNP transistors are formed similarly in some embodiments.

Other features of the invention are described below. The invention is defined by the appended claims.

BRIEF DESCRIPTION OF THE DRAWINGS

FIGS. 4–16 are cross-section illustrations of the BiCMOS structure during fabrication according to the present invention.

DESCRIPTION OF THE PREFERRED EMBODIMENTS

Figure 1:
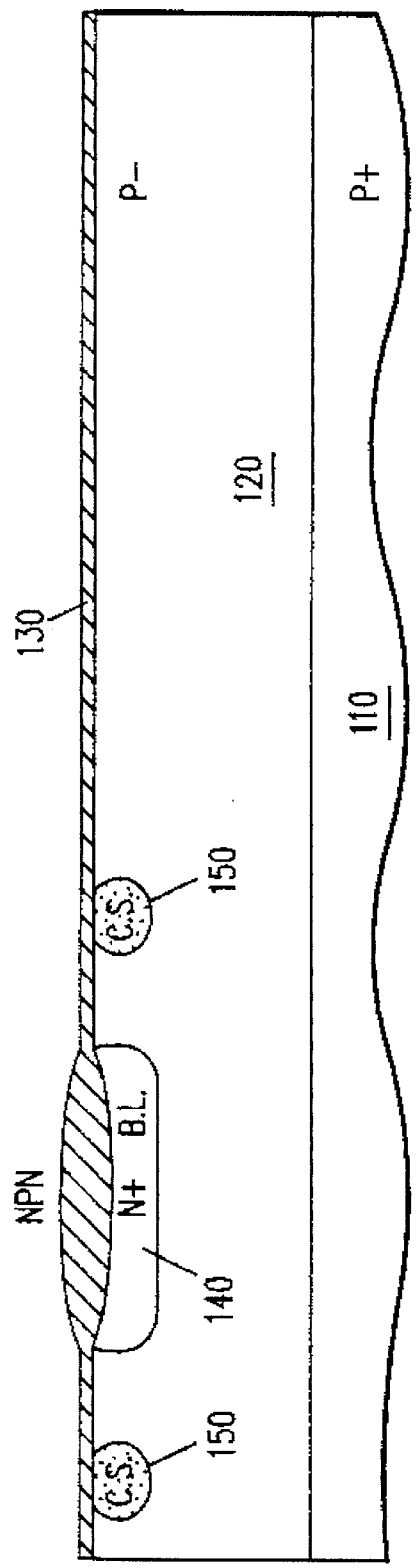
FIGS. 1 and 2 illustrate cross sections of a BiCMOS structure during fabrication according to the present invention.

FIG. 1 illustrates the initial steps of the fabrication of a BiCMOS structure suitable for high frequency, high current drive applications. Below, the particular materials, layer thicknesses, temperatures, doping concentrations and doses and other particulars are merely illustrative and do not limit the invention unless specifically noted otherwise.

The fabrication starts with P+ monocrystalline silicon substrate 110 having a resistivity of 24–36 ohm-cm. P– layer 120 is grown epitaxially on substrate 110. In some embodiments, the thickness of layer 120 is 5 to 10 µm, and the doping concentration is $1 \times 10^{15}$ atoms/c³. In some embodiments, the fabrication starts with a P– wafer, and epitaxial layer 120 is omitted.

The structure is denuded. A silicon dioxide layer 130 is then grown thermally at 900° C. to a thickness of 250 Å. A photoresist mask (not shown) is formed and arsenic is implanted to form N+ buried layer 140 of the bipolar transistor. The resulting net N type doping concentration is $2 \times 10^{19}$ atoms/cm³.

The resist mask is stripped, and the buried layer is annealed at 1,100° C. for 75 minutes. During the anneal, the thickness of oxide 130 increases, especially over the heavily doped buried layer.

A photoresist mask (not shown) is formed to expose channel stop region 150 laterally surrounding the buried layer 140. Boron is implanted into region 150 at an energy of 150 KeV. The dose is $1 \times 10^{14}$ atoms/cm$^2$, and the resulting net doping concentration is $1 \times 10^7$ atoms/cm$^3$. The doping concentration is chosen on the one hand sufficiently high to obtain a low leakage current and a high punchthrough voltage between the collector of the transistor being described and other collectors, if any, formed in the same integrated circuit. On the other hand, the doping concentration is sufficiently low to get a low capacitance between buried layer 140 and channel stop region 150.

The resist is then stripped, and channel stop region 150 is annealed in a non-oxidizing nitrogen-containing ambient at 950° for 45 minutes.

Figure 2:
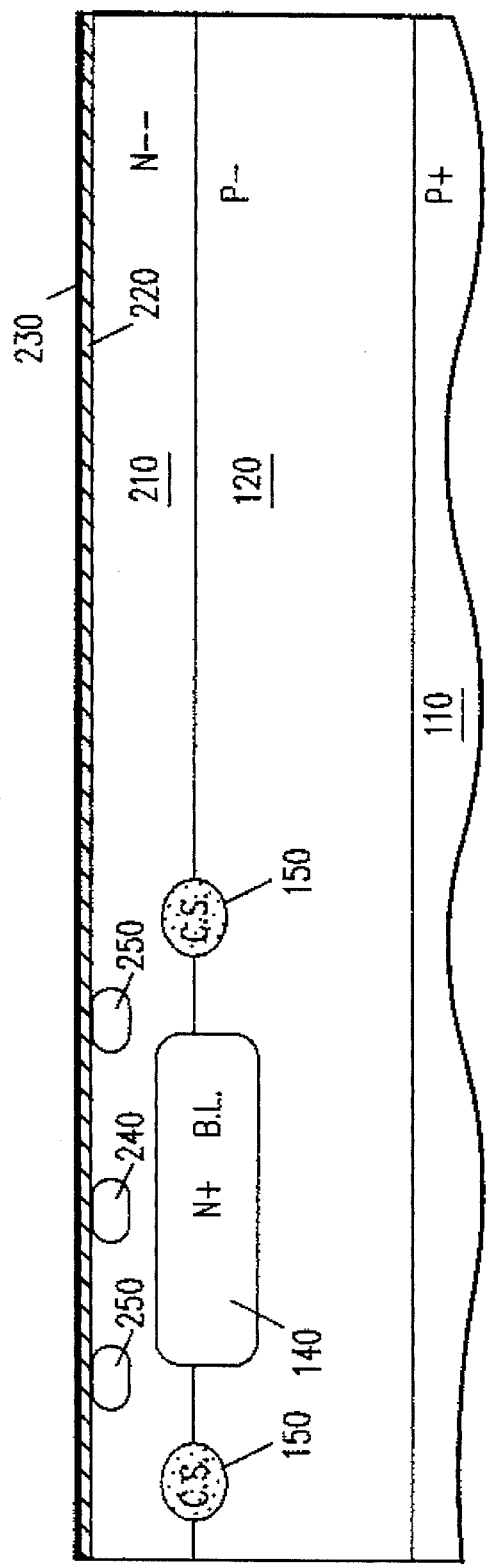

Oxide 130 is then stripped, and N— layer 210 (FIG. 2) is grown epitaxially over the structure to a thickness of about 1.2 μm. The doping concentration in layer 210 is about $4.5 \times 10^{14}$ atoms/cm$^3$. Buried layer 140 and channel stop region 150 extend some distance into layer 210 due to dopant diffusion.

Pad silicon dioxide layer 220 is formed over the layer 210 to a thickness of 450 ÅA. Layer 220 is grown by thermal oxidation performed at 900° C. for 20 minutes. Buried layer 140 and channel stop region 150 diffuse out further during the formation of layer 220.

Figure 3:
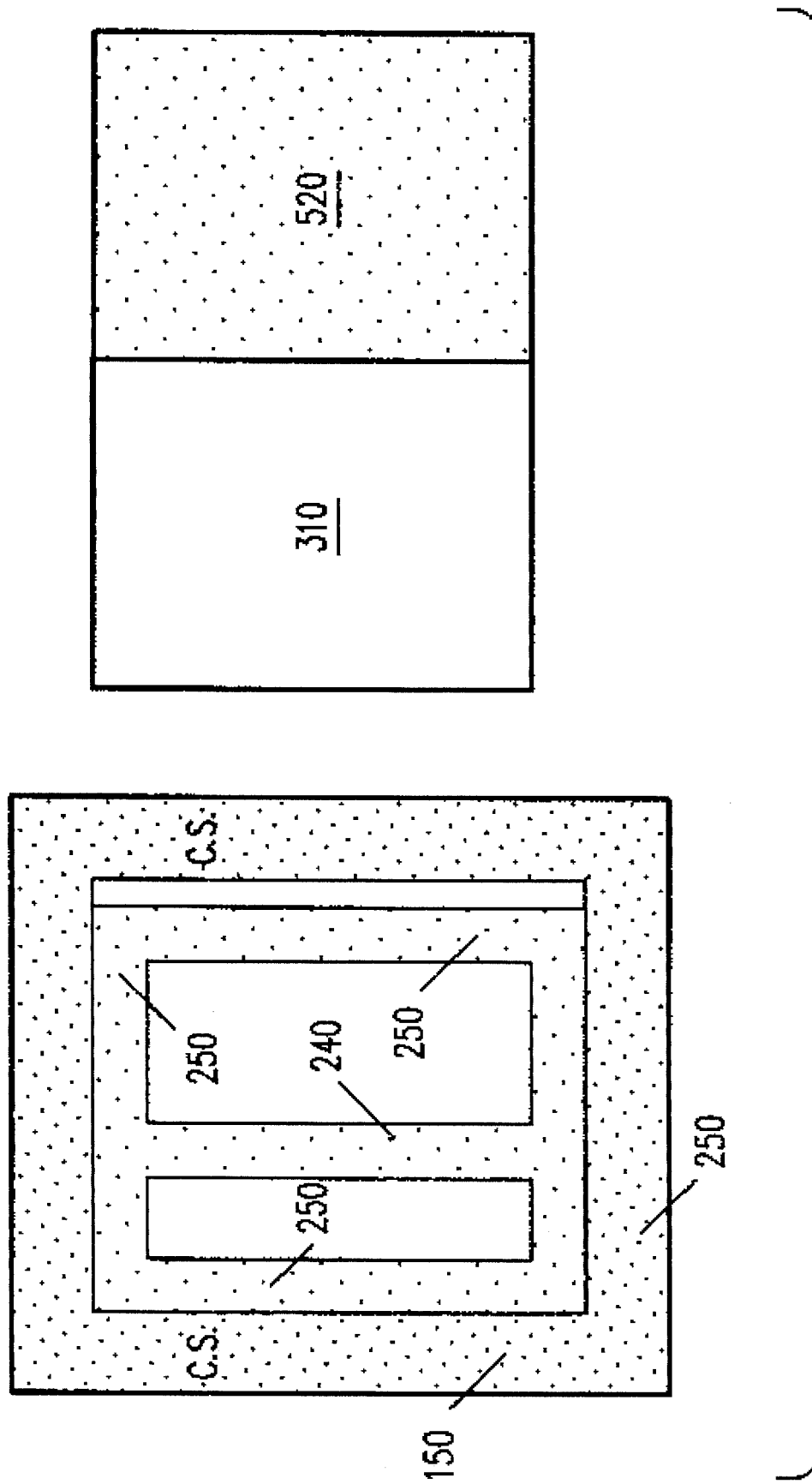
FIG. 3 is a top view illustrating certain features of the BiCMOS structure.

Next a photoresist mask (not shown) is formed, and phosphorus is implanted to form N collector region 240 and N guard ring 250. The implantation energy is 180 KeV, the dose is $3 \times 10^{12}$ atoms/cm$^2$, and the net doping concentration is $4.5 \times 10^{16}$ atom/cm$^3$. Guard ring 250 (FIGS. 2, 3) laterally surrounds the bipolar transistor active region. Collector region 240 meets the guard ring on two sides as shown in FIG. 3. In some embodiments, collector region 240 meets the guard ring on one side only or does not meet the guard ring at all. Such a smaller collector region provides a lower collector-base capacitance but, on the other hand, a higher collector resistance. The doping concentration, stated above to be $4.5 \times 10^{16}$ atoms/cm$^3$, is generally optimized for a trade-off between a large current density and a small collector-base capacitance. Because the higher doped collector region 240 does not extend throughout the active region surrounded by guard ring 250, the extrinsic collector-base region has a reduced capacitance. The unity gain frequency Ft is high as a result.

Due to dopant diffusion in subsequent processing steps, guard ring 250 will meet buried layer 140. A portion of the guard ring will provide a sink region for contacting the collector region through the buried layer. Collector region 240 will meet buried layer 140 to provide a low collector resistance.

Silicon nitride layer 230 is deposited over the pad oxide to a thickness of 1350 Å.

A photoresist mask (not shown) is formed that exposes the location of a to-be-formed N-well 310 (FIGS. 3, 4) of the PMOS transistor. Nitride 230 is etched away at the location of well 310. The photoresist is then stripped, and phosphorus is implanted with nitride 230 as a mask to form well 310 in epitaxial layer 210. The net doping concentration of well 310 is $7 \times 10^{16}$ atoms/cm$^3$.

The structure is then oxidized at 950° C. for 180 minutes to increase the thickness of pad oxide 220 over well 310 to about 5,000 Å. Silicon nitride 230 inhibits oxidation and oxidation-induced dopant updiffusion at the location of the bipolar and NMOS transistors.

Figure 6:
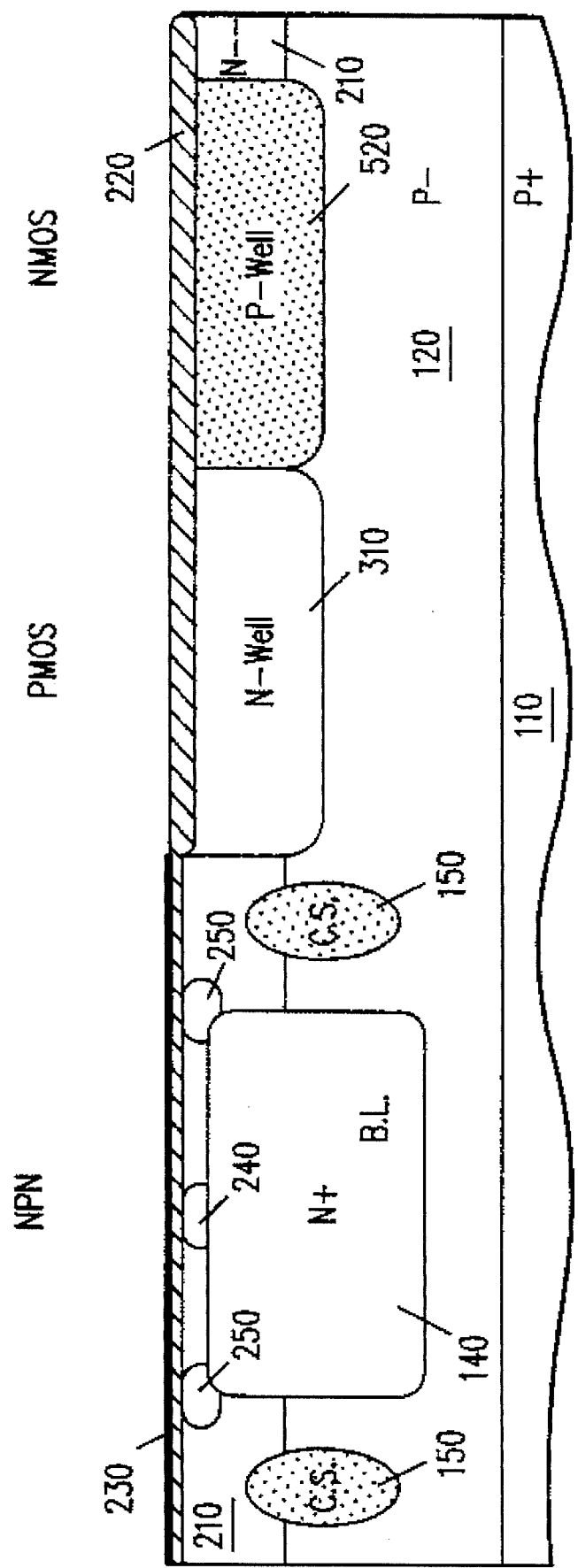

Next, photoresist mask 510 (FIG. 5) is formed over the bipolar transistor. Nitride 230 is etched away over the to-be-formed P-well 520 (FIGS. 3, 6). Resist 510 is stripped, and the bipolar transistor remains covered by nitride 230. During the subsequent drive-in of wells 310, 520 (described below), silicon nitride 230 inhibits oxidation over the bipolar transistor. Layer 230 also inhibits oxidation-enhanced diffusion of buried layer 140. Because oxidation is inhibited, oxidation-induced stacking faults in the bipolar transistor are reduced, leading to a better yield. Reducing oxidation of epitaxial layer 210 and the oxidation-enhanced upward diffusion of layer 140 allows using thinner epitaxial layer 210. Making epitaxial layer 210 thinner reduces the resistance of the vertical collector portions including the portion containing collector region 240 and that portion of ring 250 which provides the sink region. Higher speed is provided as a result. Of note, collector region 240 has a lighter doping than buried layer 140 and hence collector region 240 provides a large component of the collector resistance.

Thinner epitaxial layer 210 permits in some applications the P-well 520 to be shallower. More particularly, some applications require P-well 520 to reach through epitaxial layer 210 to meet epitaxial layer 120 and thus to electrically contact the P+ substrate 110 which in these applications is tied to the common ground of the NMOS transistors. In addition to contacting the common ground, P-well 520 diffusing through N— layer 210 allows isolating the N-well 310 from other N-wells (not shown), if any, in the same integrated circuit. Since epitaxial layer 210 is thin, well 520 can be made shallower. Because shallower well 520 can be created with a lower doping dose, the lateral diffusion of the P-well dopant is reduced, allowing the MOS transistors to have a smaller area and, therefore, smaller capacitances and higher speed. In addition, thinner epitaxial layer 210 advantageously reduces the size of active regions of parasitic transistors.

Nitride 230 over the bipolar transistor also reduces the diffusion of collector region 240, guard ring 250 and channel stop region 150. Reducing the diffusion of regions 240, 250, 150 allows reducing the bipolar transistor area and, therefore, the transistor capacitances including the base-collector capacitance. Reducing the lateral and downward diffusion of buried layer 140 reduces the collector-substrate capacitance.

A photoresist mask (not shown) is formed that exposes the to-be-formed well 520. The mask need not be perfectly aligned with the boundary between N-well 310 and P-well 520 because the thicker oxide 220 over N-well 310 masks the N-well during the P-well implant.

Some embodiments do not use the oxide over N-well 310 as a mask, and instead rely on the photoresist to mask the N-well.

Boron is implanted at an energy of 150 KeV and a dose of $3.3 \times 10^{12}$ atoms/cm$^2$ to form P-well 520. The photoresist is then stripped, and the wells are driven in at the temperature of 1,100° C. for 50 minutes in an oxidizing ambient. During this step, the thickness of oxide 220 increases over the MOS transistors to planarize the surface of wells 310, 520. Over the bipolar transistor the oxidation is inhibited by nitride 230 as described above. Buried layer 140 and channel stop regions 150 increase during this step due to dopant diffusion. The dopant diffusion, however, is inhibited by layer 230 as described above. Guard ring 250 and collector region 240 also increase and meet the buried layer to provide a well-defined guard ring and a well-defined collector region. Thus the active region of the bipolar transistor becomes completely enclosed by the guard ring and the buried layer within epitaxial layer 210. Because epitaxial layer 210 is thin, the guard ring and the collector region need not be doped as heavily to meet buried layer 140 as would be required if epitaxial layer 210 were thicker. The lighter doping of guard ring 250 and collector region 240 reduces the junction capacitances in the bipolar transistor and thus provides higher speed.

In an alternate embodiment, the implant that forms buried layer 140 of FIG. 1 forms also a buried layer 140.1 (FIG. 7) at the location of the to-be-formed PMOS transistor. The implant that forms channel stop region 150 (FIG. 1) forms also a buried layer 150.1 at the location of the to-be-formed NMOS transistor. N-well 310 and P-well 520 are created using shallow implants sufficient to cause the wells to meet the respective buried layers 140.1, 150.1.

The techniques of FIGS. 1–6 allow high speed bipolar transistors to be integrated in an existing CMOS twin well process without using buried layers 140.1, 150.1. Hence, in FIG. 6, the doping of regions 140, 150 can be optimized for the bipolar transistor to obtain a low leakage current, low capacitances and a low collector resistance, as the doping does not affect the MOS transistors. The result is decoupling the MOS and bipolar transistor characteristics from each other without increasing the process complexity.

Figure 7:
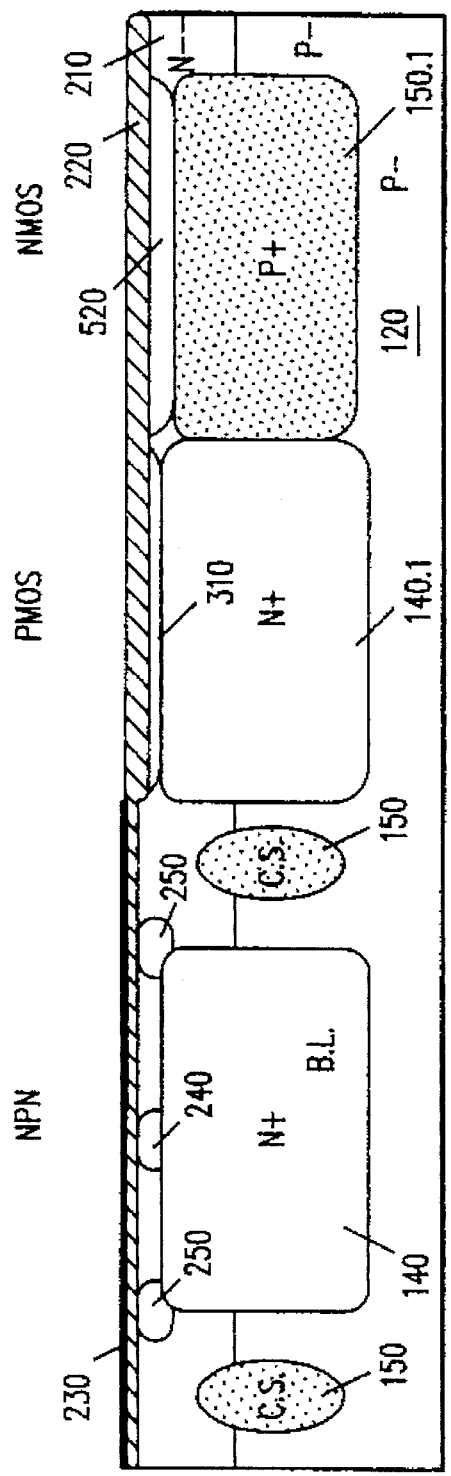

The remaining fabrication steps are similar for the embodiments of FIGS. 6 and 7 and are illustrated only for the embodiment of FIG. 6 for simplicity.

Nitride 230 and oxide 220 are stripped. Silicon dioxide layer 810 (FIG. 8) is formed to a thickness of 250 Å. Layer 810 is formed by thermal oxidation performed at 900° C. for 60 minutes.

Silicon nitride layer 820 is deposited to a thickness of 1,850 Å. A photoresist mask (not shown) is formed that exposes the regions in which field oxide 830.1, 830.2 is to be grown by the LOCOS process. A composite nitride/oxide etch removes silicon nitride 820 and silicon dioxide 810 off the regions exposed by the mask.

The photoresist is then stripped, and another photoresist mask (not shown) is formed for a P+ boron implant that creates field implant regions 840, 840.1. The boron is implanted at an energy of 30 KeV and a dose of $5.5 \times 10^{13}$ atoms/cm$^2$. The resulting net doping concentration of regions 840, 840.1 is $2 \times 10^{17}$ atoms/cm$^3$. The field implant region 840.1 that overlies channel stop region 150 meets the channel stop region to create a P+ ring around the bipolar transistor. This ring isolates the bipolar transistor from other transistors of the integrated circuit.

The photoresist is then stripped, and field oxide 830.1, 830.2 is thermally grown on the exposed silicon areas by the LOCOS process at 1,000° C. for 160 minutes. Oxide regions 830.1 overlie field implant regions 840, 840.1 and guard ring 250. Field oxide regions 830.1 and field implant regions 840, 840.1 surround laterally each of the bipolar, PMOS, and NMOS transistors. Field oxide region 830.2 extends between collector region 240 and the portion 250.1 of guard ring 250. The guard ring portion 250.1 forms a sink region providing a low resistance path to buried layer 140 from the to-be-formed collector contact (not shown in FIG. 8). Field oxide region 830.2 separates the sink region 250.1 from the to-be-formed base region (not shown in FIG. 8) to reduce the base-collector capacitance.

Using LOCOS isolation rather than a more stressful trench isolation reduces the stacking fault defect density thus improving the yield.

Nitride 820 and oxide 810 are then stripped. Threshold-voltage-adjust implants are performed optionally into N-well 310 or P-well 520 or both.

Gate oxide layer 910 (FIG. 9) is thermally grown over the exposed silicon areas of the MOS and bipolar transistors at 900° C. for 28 minutes to a thickness of 150 Å. A protective intrinsic polysilicon layer 920 is deposited over the wafer to protect the gate oxide during subsequent processing steps.

Figure 14:
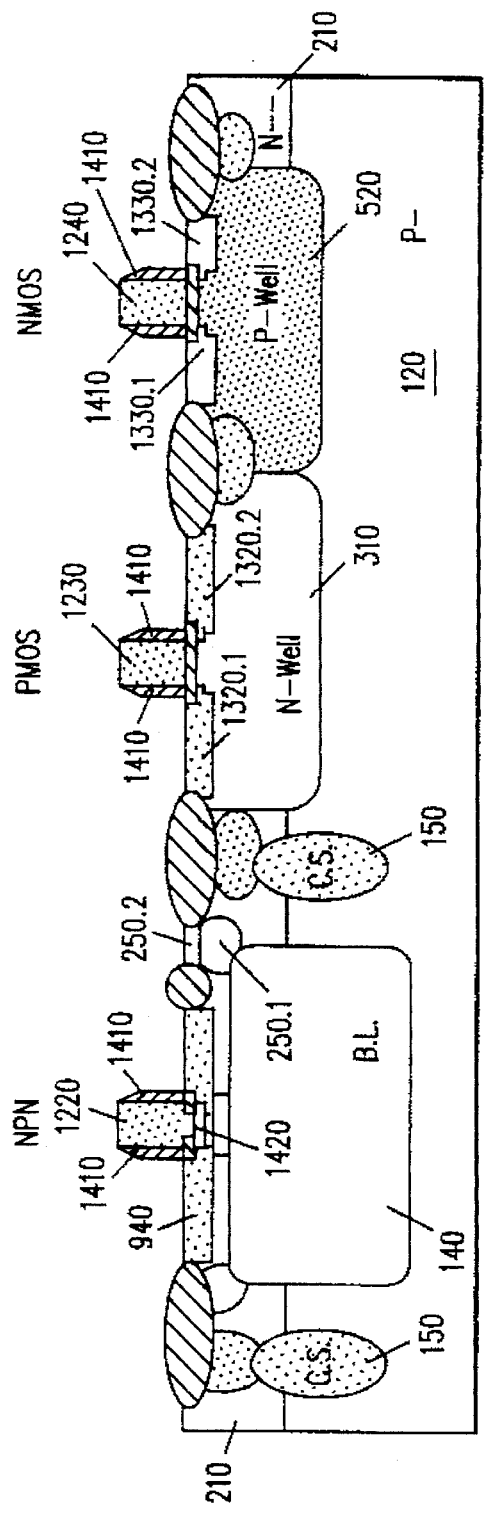

A base implant mask 930 is formed from photoresist. Boron is implanted at an energy of 20 KeV and a dose of $5 \times 10^{13}$ atoms/cm$^2$ to convert top portion 940 of epitaxial layer 210 in the bipolar transistor active region to the P conductivity type. Polysilicon layer 920 and gate oxide 910 combine to reduce the implant width, providing a shallower base with existing implanters. Because the base is formed after the gate oxide, the base region does not experience any oxidation or dopant redistribution during the gate oxide formation and in some embodiments does not see any significant diffusion/anneal cycles until the RTP (rapid thermal processing) anneal which forms the emitter region (not shown in FIG. 9). This RTP anneal is described below in connection with FIG. 14. Thus a shallow well-defined base region results. The shallow base region leads to a higher bipolar transistor speed and allows epitaxial layer 210 to be thinner.

The width of collector region 240 is reduced by the base implant. The enhanced doping of region 240 reduces the base width over region 240.

Figure 9:
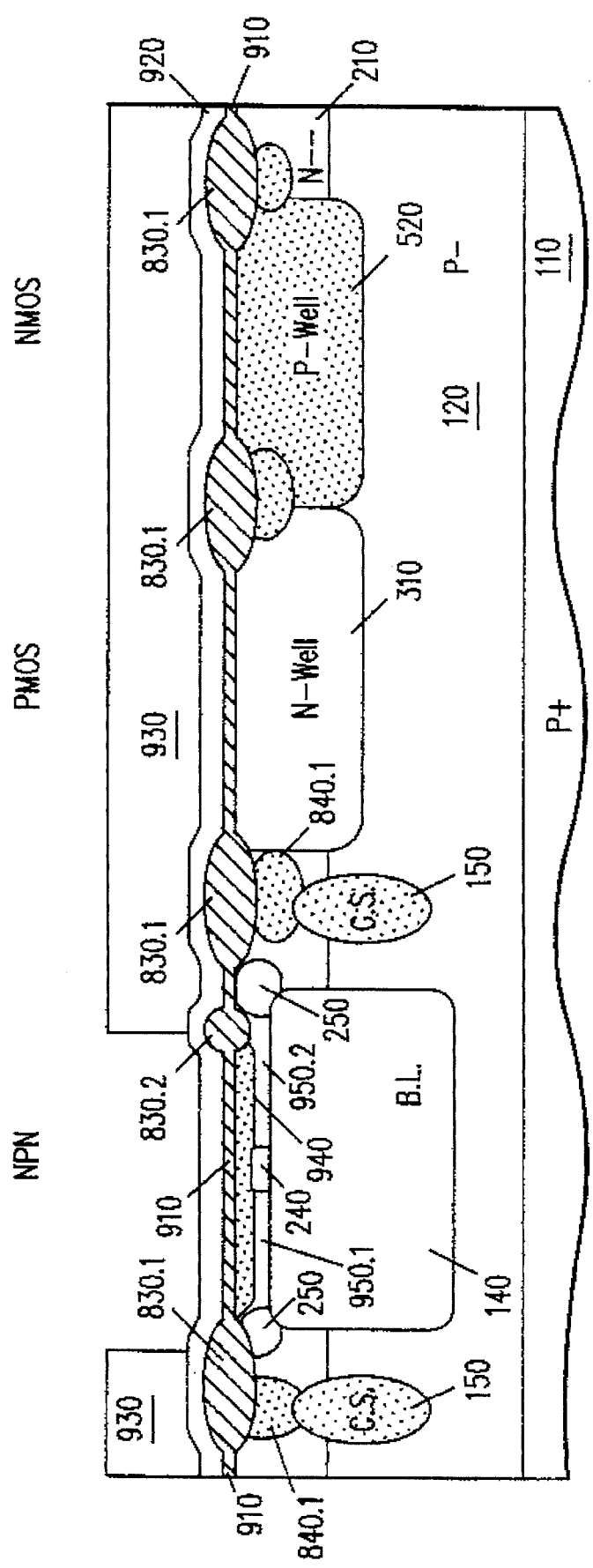

Field oxide region 830.1 and P+ regions 840.1, 150 laterally surround and isolate the bipolar transistor. Substrate 110, and hence P+ regions 840.1, 150, are typically held at the lowest potential of the circuit during operation. Guard ring 250 between base region 940 and field implant region 840.1 prevents the P dopant of region 840.1 from counter-doping the epitaxial layer at the guard ring location. Such counterdoping could cause field implant region 840.1 to meet, or come close to, the base region leading to a base-to-substrate short or high leakage current. Further, the guard ring keeps the depletion layer between region 840.1 and the N type portion of epitaxial layer 210 farther from the base, thereby increasing the punchthrough voltage of the parasitic PNP transistor formed by the base region, the P+ region 840.1 and the portion of epitaxial layer 210 between the base region and the P+ region. Guard ring 250 also impedes the formation of the inversion layer between the base region and the P+ region and thus further reduces the current leakage from the base region to substrate 110. In some embodiments, as shown in FIG. 9, P+ regions 840.1, 150 are separated from buried layer 140 and guard ring 250 by portions of epitaxial layers 210, 120 which portions have a lower doping concentration than the two P+ regions, the buried layer and the guard ring. The collector capacitance is reduced as a result, and the breakdown voltage between channel stop region 150 and buried layer 140 is increased. The base region is separated from the guard ring and the buried layer by N— regions 950.1, 950.2 of epitaxial layer 210 which have a lower doping concentration than the base region and the guard ring. The collector-base capacitance is reduced as a result.

Photoresist 930 is stripped, and a photoresist mask 1010 (FIG. 10) is formed to define the emitter. Polysilicon 920 is etched through an opening in mask 1010 by a plasma etch. The etch stops on gate oxide 910.

As shown in FIG. 11, resist 1010 is removed, and gate oxide 910 is etched with polysilicon 920 as a mask. The resulting opening 1110 exposes region 940 at the location of the to-be-formed emitter. During the etch, polysilicon 920 protects the gate oxide over the wells of the MOS transistors. In some embodiments, the gate oxide etch is a wet buffered oxide HF etch designed to reduce any damage to, and removal of, the P doped region 940.

Figure 12:
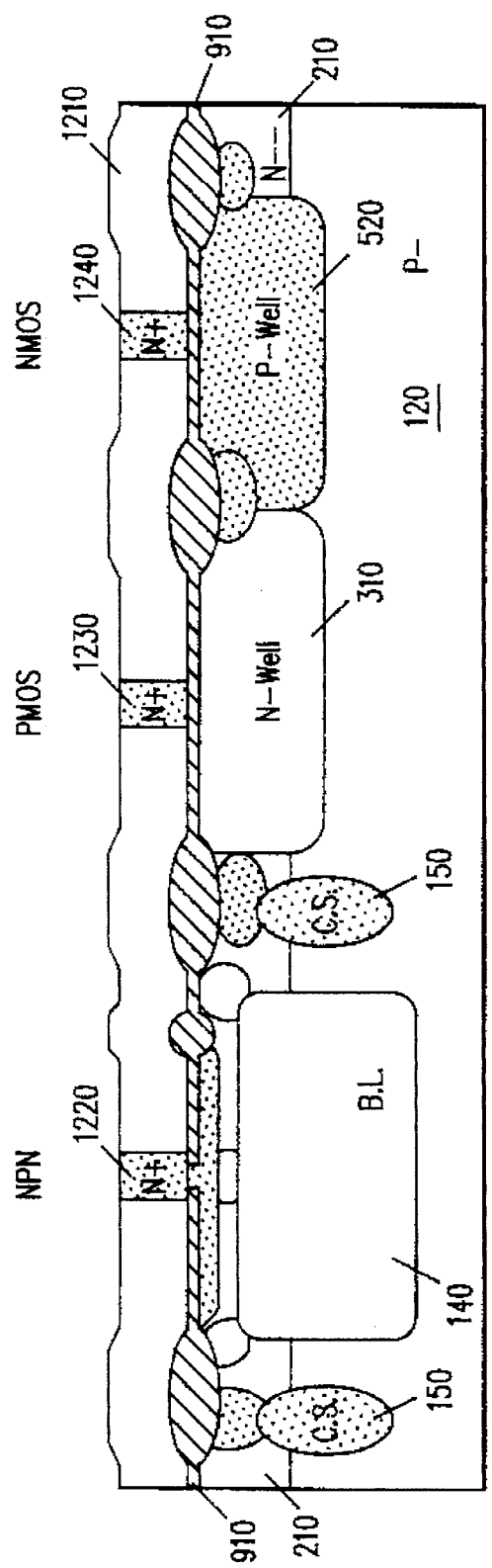

Intrinsic polysilicon is deposited by chemical vapor deposition (CVD) over the wafer at 630° C. to a thickness of 3,250 Å to combine with the polysilicon 920 to form polysilicon layer 1210 (FIG. 12). Even though layer 920 is removed at the emitter location, layer 1210 has a substantially uniform thickness because layer 920 is thin compared to layer 1210.

A masked implant of arsenic at an energy of 100 KeV and a dose of $1.2 \times 10^{16}$ atoms/cm$^2$ creates N+ emitter contact region 1220 and N+ gate regions 1230, 1240. The net doping concentration of emitter contact region 1220 and gate regions 1230, 1240 is $1 \times 10^{20}$ atoms/cm$^3$.

An optional P type masked implant forms resistors (not shown) in layer 1210.

The polysilicon is then annealed at 900° C. for 15 minutes.

Figure 13:
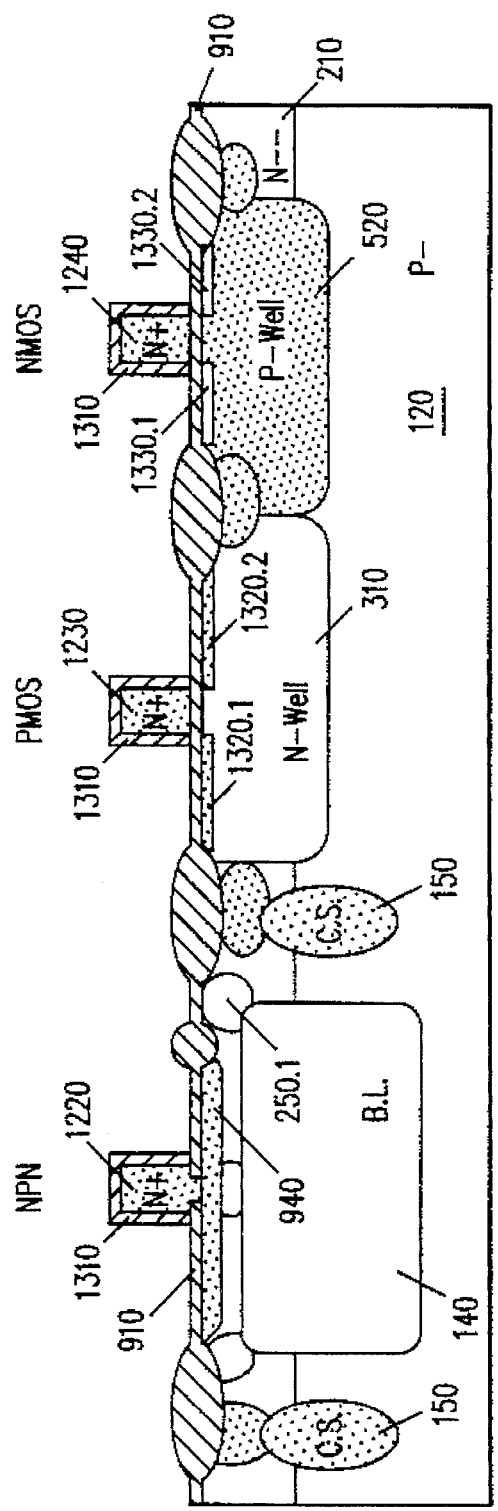

Polysilicon 1210 is then masked by a photoresist (not shown) and etched to define emitter contact region 1220 and gate regions 1230, 1240 (FIG. 13). Polysilicon resistors (not shown), if any, are also defined at this step. The etch stops on gate oxide 910 which protects epitaxial layer 210 and, in particular, the damage-sensitive base region 940. Emitter contact region 1220 extends over the edges of the emitter opening in oxide 910.

Silicon dioxide 1310 is grown thermally at 900° C. for 30 minutes over polysilicon 1210 to a thickness of 80 Å.

The NMOS transistor is then masked by a photoresist (not shown), and a lightly doped drain (LDD) implant of boron is performed at an energy of 45 KeV and a dose of $1 \times 10^{13}$ atoms/cm$^2$ into N-well 310 and region 940 while gate region 1230 and emitter contact region 1220 mask, respectively, the PMOS channel region and the intrinsic base region. The resulting net doping concentration of the extrinsic base region is $4 \times 10^{18}$ atoms/cm$^3$. This implant forms lightly doped source/drain regions 1320.1, 1320.2 of the PMOS transistor and reduces the extrinsic base resistance.

In some embodiments, region 940 is not doped during this step.

The photoresist is stripped. Another photoresist mask (not shown) is formed over the bipolar and PMOS transistors. An LDD implant of arsenic is performed at an energy of 90 KeV and a dose of $4 \times 10^{13}$ atoms/cm$^2$ while gate region 1240 masks the NMOS channel region. This implant forms lightly doped source/drain regions 1330.1, 1330.2 of the NMOS transistor. In some embodiments, sink region 250.1 is also doped during this implant.

A conformal layer of silicon dioxide is deposited by CVD at 650° C. An optional "silicide exclusion" mask (not shown) is formed from photoresist over selected areas to protect the oxide and thus to prevent formation of a metal silicide on such areas in subsequent processing described below. This CVD oxide is etched anisotropically to form spacers 1410 (FIG. 14) on the sidewalls of emitter contact region 1220 and gate regions 1230, 1240. The gate oxide not covered by the spacers and by polysilicon regions 1220, 1230, 1240 is removed during this etch. The remaining gate oxide over the bipolar transistor is completely covered by emitter contact region 1220 and spacers 1410. The overetch required is uniform over the bipolar, PMOS and NMOS transistors because the gate oxide has a uniform thickness over the bipolar and MOS transistors, because the CVD silicon dioxide has a uniform thickness over the transistors except, perhaps, on the sidewalls of polysilicon portions 1220, 1230, and 1240, and because oxide 1310 is thin compared to the CVD oxide.

A masked N+ arsenic implant is performed into source/drain regions 1330.1, 1330.2 and sink region 250.1 at an energy of 30 KeV and a doping dose of $3 \times 10^{15}$ atoms/cm$^2$. The resulting doping concentration in the top portion 250.2 of the sink region is $1 \times 10^{20}$ atoms/cm$^3$.

A masked P+ boron implant is performed into source/drain regions 1320.1, 1320.2 and region 940 at an energy of 45 KeV and a dose of $3 \times 10^{15}$ atoms/cm$^2$. The resulting doping concentration in the extrinsic base region not covered by spacers 1410 is $5 \times 10^{19}$ atoms/cm$^3$. These implants complete the doping of the source/drain regions of the NMOS and PMOS transistors and reduce the resistivity of the sink region and the extrinsic base region.

Next, an RTP (Rapid Thermal Processing) anneal performed at 1030° C. for 20 seconds causes the N-type dopant from emitter contact region 1220 to diffuse into region 940 and convert the top portion 1420 of the region to N conductivity type. This portion is the emitter region. The RTP anneal is the first major high temperature step after formation of base region 940 (FIG. 9). The previous steps had but a small effect on region 940 compared with the RTP anneal. The base region is shallow and well-defined as a result.

A refractory metal, titanium in some embodiments, is deposited over the structure by chemical vapor deposition to a thickness of 600 Å. The structure is heated and kept at 650° C. for 30 minutes to react the titanium that contacts silicon surfaces with the silicon. As a result, titanium silicide 1510 (FIG. 15) is formed on the exposed silicon surfaces including the surfaces of the extrinsic base region, emitter contact region 1220, sink region 250.1, and source/drain and gate regions of the MOS transistors. The sheet resistance of layer 1510 is 3 ohms/square. The titanium silicide reduces resistance to the intrinsic transistor regions and thus increases the circuit speed and reduces the power consumption.

Titanium nitride layer 1520 is deposited over, and in contact with, the entire silicide 1510 by chemical vapor deposition to a thickness of 3000 Å. The deposition temperature is 650° C. Layer 1520 is patterned to form local conductive lines that contact titanium silicide 1510. As used herein, the term "local conductive lines" means conductive lines that are formed after the transistors but before formation of any interlevel dielectric in which contact openings are formed to contact the transistors. Layer 1520 has a sheet resistance of 1.5 ohms/square. A different sheet resistance can be obtained by changing the thickness of layer 1520. Conductive lines 1520 are used as interconnects and/or as extensions of the emitter, base, source/drain and gate regions. Such extensions allow forming contacts to these regions over field oxide 830.1, 830.2 rather than over those regions themselves.

Figure 15:
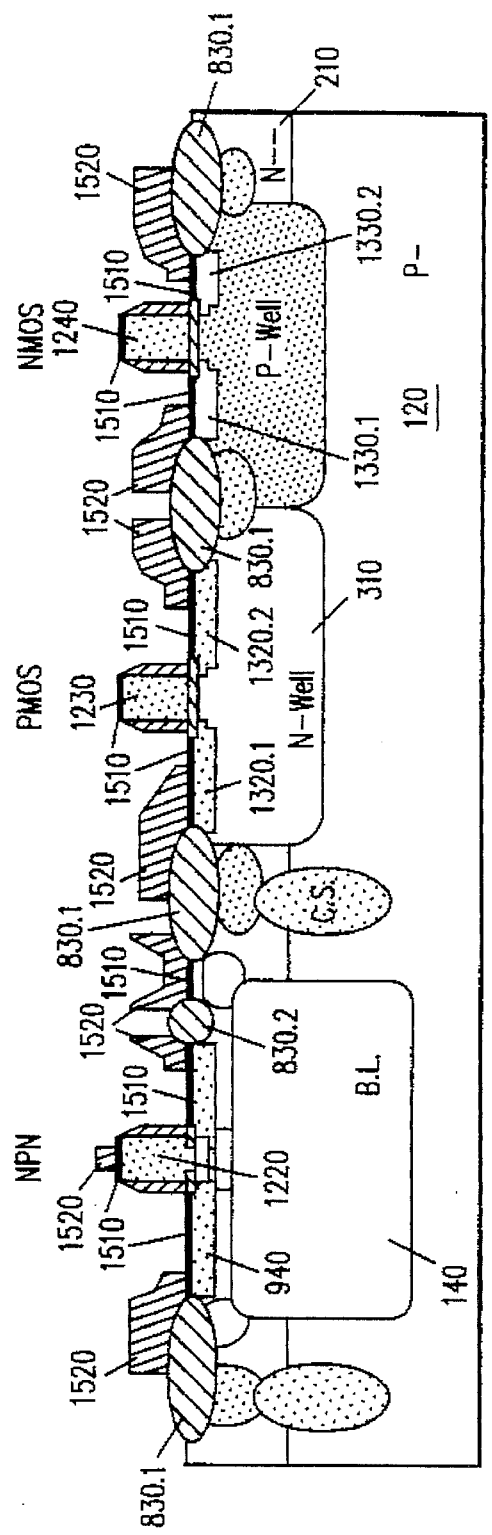

In the embodiment of FIG. 15, TiN is etched off the gate regions. A conductive line 1520 runs along the top surface of emitter contact region 1220, reducing the emitter resistance. In some embodiments, TiN lines run along, and/or contact, the top surfaces of gate region 1230 and/or gate region 1240. In some embodiments, the spacing between the TiN lines over base region 940 on the one hand and emitter contact region 1220 on the other hand is smaller than the minimal photolithography dimension obtainable by the fabrication equipment. The same is true for the spacing between lines 1520 and each of gate regions 1230, 1240. Spacers 1410 help isolate conductive lines 1520 from regions 1220, 1230, 1240. Because lines 1520 are thick, a low resistance can be obtained with but a small overlap of lines 1520.over base region 940 and over the source and drain regions. The areas of the base, source and drain regions can therefore be reduced, providing a high packing density and a high speed.

Figure 16:
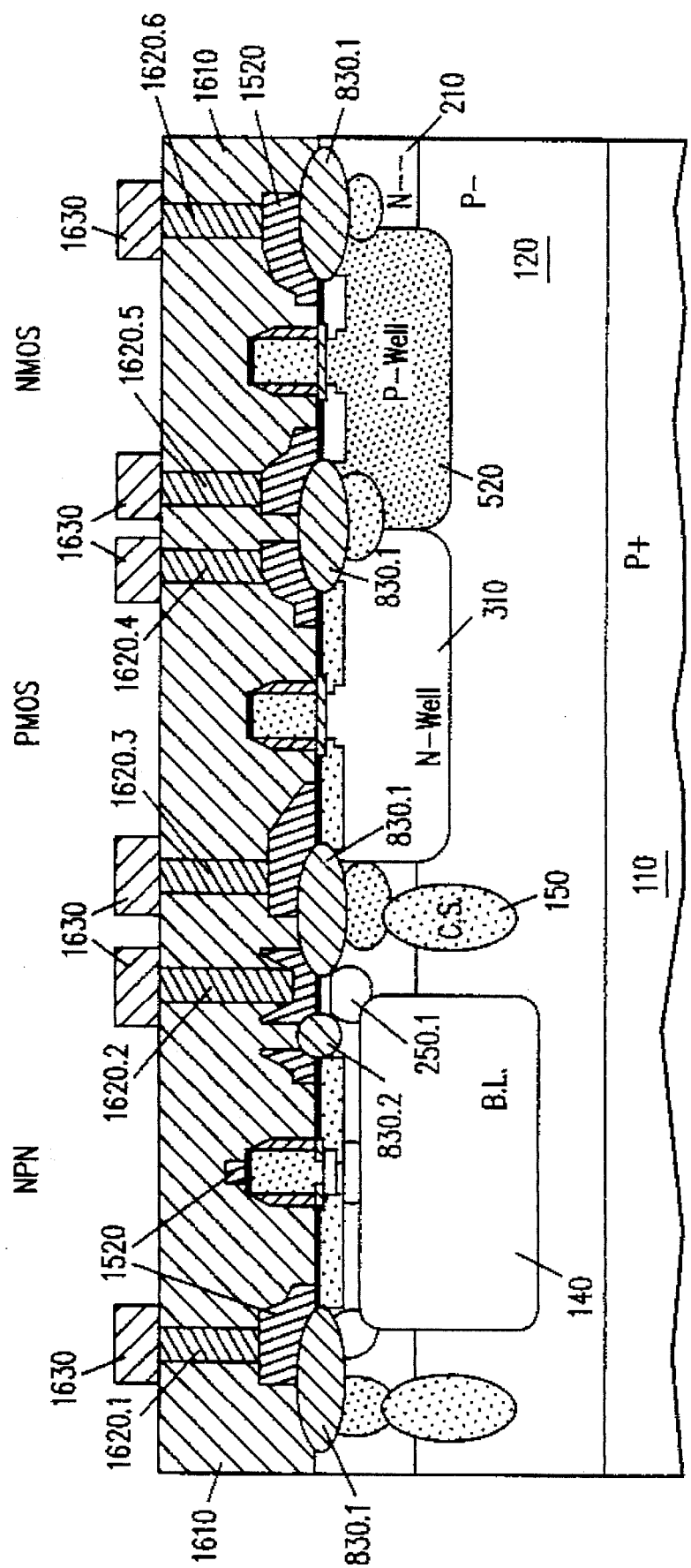

As shown in FIG. 16, interlevel dielectric 1610 is formed by TEOS deposition of silicon dioxide to a thickness of 1,000 Å, TEOS deposition of boron and phosphorus doped silicon dioxide to a thickness of 7,000 Å, and a densification and reflow of the boron and phosphorus doped silicon dioxide. Contact openings are etched in layer 1610. The contact openings terminate on conductive lines 1520. Tungsten is deposited by CVD and etched back to form tungsten plug contacts 1620.i in the contact openings. The plugs physically contact the titanium nitride lines 1520. Collector contact 1620.2 physically contacts titanium nitride 1520 over sink region 250.1. Conductive lines 1630 are formed from Ai—Si—Cu or some other suitable material. The fabrication is completed using known processing techniques.

Figure 17:
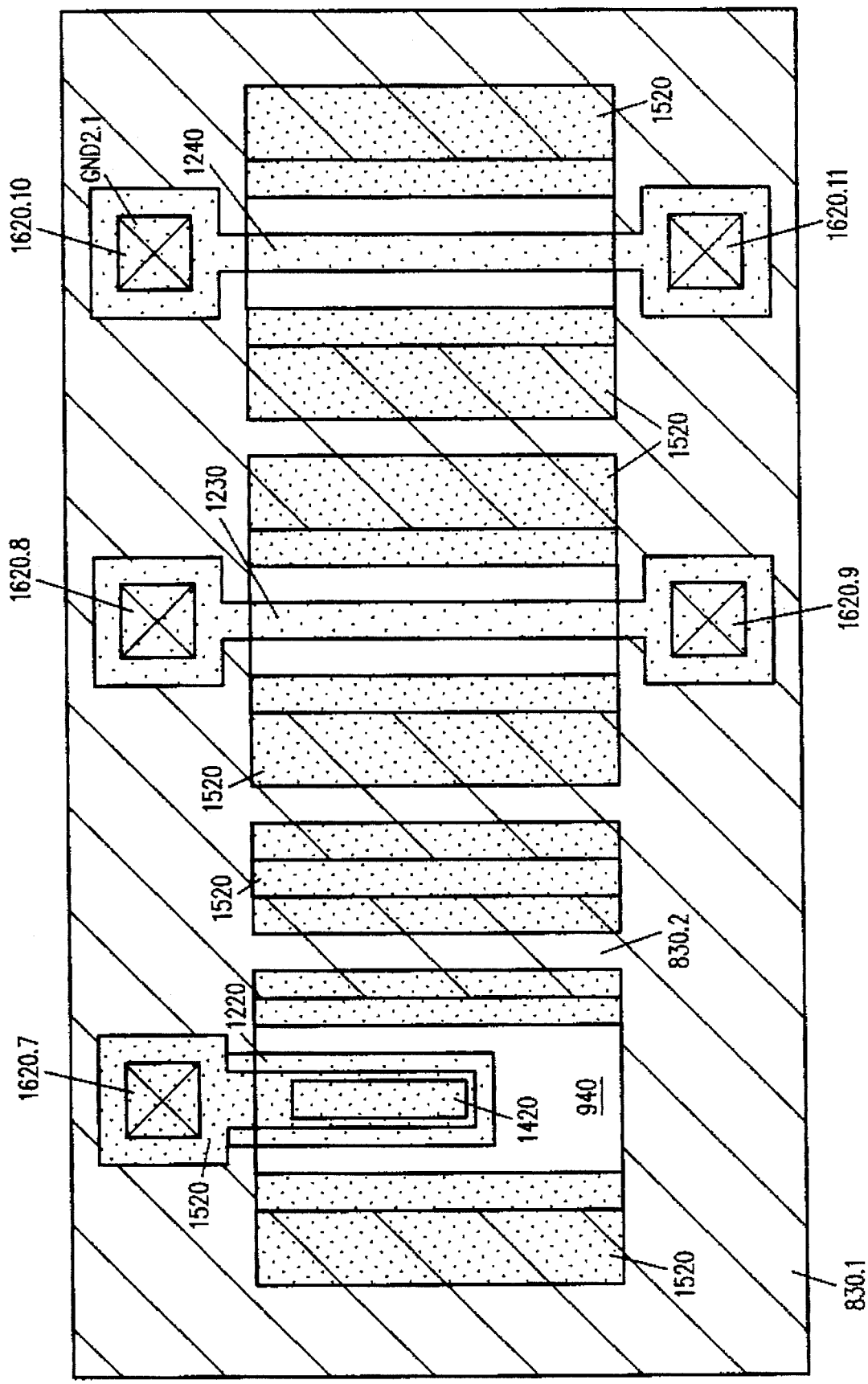
FIG. 17 is a top view illustrating certain features of the BiCMOS structure fabricated according to the present invention.

FIG. 17 is a top view of the resulting structure. Emitter region 1420 is a non-walled emitter region. Gate oxide 910 (FIG. 13) isolates emitter contact region 1220 from base region 940 outside emitter region 1420 and, in particular, at the boundary between base region 940 and field oxide 830.1, eliminating yield and leakage problems described in U.S. patent application Ser. No. 08/085,436 filed by M. J. Grubisich on Jun. 30, 1993 and hereby incorporated herein by reference. In some embodiments, emitter 1420 is a walled emitter. In some embodiments, collector region 240 (FIG. 3) is in top view coextensive with emitter region 1420, providing a low base-collector capacitance. Titanium nitride lines 1520 reduce the resistance allowing a low resistance to be obtained with thinner titanium silicide 1510 (FIG. 15), especially since the titanium nitride has a lower resistivity than the titanium silicide. Because the titanium silicide is thinner, the consumption of silicon during the silicide formation is reduced, which lessens the chance of shorting out the junctions between the base and the collector and between the source/drain regions and the MOS wells 310, 520. Hence these junctions can be made shallower. The silicide outgrowth which results in stringers on spacers 1410 (FIG. 15) is also reduced, leading to a better yield. Further, it has been found that the formation of stringers can be inhibited by lower silicidation temperatures, but the lower temperature also increases the silicide resistivity. Due to lines 1520, the stringer formation is inhibited by making titanium silicide thin. Hence, the silicidation temperature can be made higher to reduce the silicide resistivity.

Emitter contact opening 1620.7 and gate contact openings 1620.8 through 1620.11 are formed over field oxide 830.1. Titanium nitride line 1520 runs along emitter contact region 1220 to the contact opening 1620.7, reducing the emitter resistance and thus improving the VBE matching. As a result, the emitter current and the bipolar transistor speed can be increased without increasing the emitter area.

Figure 8:
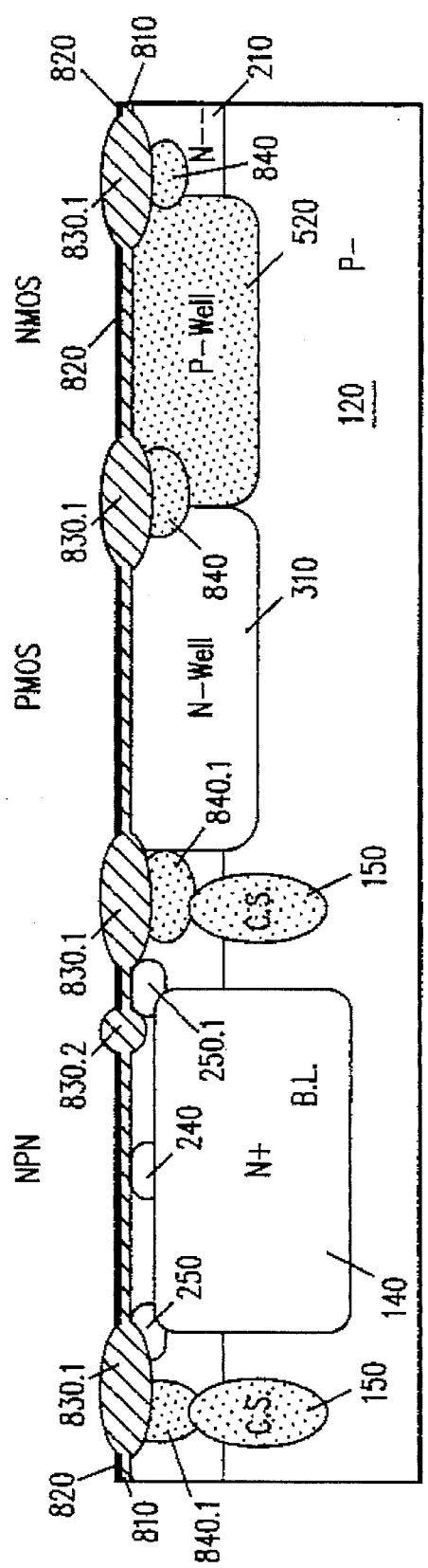

Some embodiments combine the isolation techniques of FIGS. 1–8 with other processes than those of FIGS. 9–17. For example, in some embodiments, after the structure of FIG. 8 is made, the base is formed by diffusion from a P-doped polysilicon layer as described, for example, in the U.S. Pat. No. 5,219,784 issued Jun. 15, 1993 to A. G. Solheim and incorporated herein by reference. The emitter is also formed as described in that patent. Other fabrication techniques, including non-polysilicon emitter techniques, are used with the structure of FIG. 8.

Further, the isolation techniques of FIGS. 1–8 are used in some embodiments with other silicidation/local conductive line techniques than those of FIGS. 15, 16 or without any silicidation/local conductive line techniques.

Similarly, the base and emitter formation techniques of FIGS. 9–14 are combined in some embodiments with other isolation techniques including trench isolation or junction isolation. The techniques of FIGS. 9–14 are used in some embodiments without any silicidation/local conductive line techniques or with silicidation/local conductive line techniques different from those of FIGS. 15, 16.

The silicidation/local conductive line techniques of FIGS. 15, 16 are used in some embodiments with different isolation techniques than those of FIGS. 1–8 and/or with different emitter/base formation techniques than those of FIGS. 9–14.

While the invention has been illustrated by the embodiments described above, other embodiments and variations are within the scope of the invention. In particular, the invention is not limited by any particular materials or dimensions. For example, in some embodiments, other metal-containing materials are used instead of titanium to form the non-semiconductor conductive layer 1510. Conductive lines 1520 are formed in some embodiments from other materials than titanium nitride, including other non-semiconductor materials. Lines 1520 are formed from titanium, tungsten or titanium tungsten in some embodiments. In some embodiments, the conductivity types are reversed to form PNP transistors in a BiCMOS circuit. Some embodiments include non-BiCMOS integrated circuits containing only bipolar or bipolar and MOS transistors. In some embodiments, an additional implant is performed into the collector region 240 to reduce the collector resistance. Other embodiments and variations are within the scope of the invention as defined by the following claims.

What is claimed is:

1. An integrated transistor structure comprising:

an emitter region of a first conductivity type;

a base region of a second conductivity type opposite the first conductivity type, the base region contacting the emitter region;

a first region of the first conductivity type, the first region contacting the base region and underlying and laterally surrounding the base region;

a buried layer of the first conductivity type, the buried layer underlying and contacting the first region, wherein at least a part of the first region has a lower net doping concentration than the buried layer;

a collector region of the first conductivity type, the collector region being located in the first region and overlying the buried layer, and having a higher net doping concentration than the first region;

a guard ring of the first conductivity type, the guard ring laterally surrounding the first region and the collector region, wherein at least a part of the first region contacts the guard ring and has a lower net doping concentration than the guard ring; and a second region of the second conductivity type, the second region laterally surrounding the guard ring.

2. The transistor structure of claim 1 further comprising a region separating the second region from the buried layer and the guard ring and having a lower net doping concentration than the second region, the buried layer and the guard ring.

3. The transistor structure of claim 1 further comprising an insulation overlying and contacting the second region and surrounding the base region.

4. The transistor structure of claim 1 wherein the guard ring meets the buried layer so that the guard ring and the buried layer enclose the first region laterally and from below.

5. The transistor structure of claim 1 further comprising a MOS transistor separated from the emitter and base regions and from the buried layer by the second region.

6. The transistor structure of claim 1 wherein the collector is spaced apart from the guard ring by the first region along at least a part of a periphery of the collector region.

* * * * *

UNITED STATES PATENT AND TRADEMARK OFFICE
CERTIFICATE OF CORRECTION

PATENT NO.    : 5,543,653
DATED         : August 6, 1996
INVENTOR(S)   : Michael J. Grubisich It is certified that error appears in the above-identified patent and that said Letters Patent is hereby corrected as shown below:

Column 3, line 27, delete "450ÅA" and substitute --450Å--.

Column 9, line 3, delete ".over" and substitute -- over--.

Signed and Sealed this

Eighteenth Day of March, 1997

Attest:

BRUCE LEHMAN

Attesting Officer                Commissioner of Patents and Trademarks